United States Patent
Tanaka et al.

(10) Patent No.: US 6,219,532 B1
(45) Date of Patent: Apr. 17, 2001

(54) MOVABLE RADIO TERMINAL DEVICE CAPABLE OF PRECISELY MATCHING IMPEDANCES

(75) Inventors: Masahiko Tanaka; Yoshimasa Hosonuma, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/178,304

(22) Filed: Oct. 23, 1998

(30) Foreign Application Priority Data

Oct. 28, 1997 (JP) .................................................... 9-295204
Nov. 5, 1997 (JP) .................................................... 9-320446

(51) Int. Cl.[7] .............................. H04B 1/44; H04B 1/46; H01M 10/46; H04Q 1/30
(52) U.S. Cl. ................................. 455/78; 455/78; 455/82; 455/83; 455/575; 340/311.1
(58) Field of Search .................................. 455/78, 80, 82, 455/83, 115, 129, 575; 340/426

(56) References Cited

U.S. PATENT DOCUMENTS

| | | | |
|---|---|---|---|
| 4,633,519 | * 12/1986 | Gotoh et al. | 455/277 |
| 5,673,054 | * 9/1997 | Hama | 343/744 |
| 5,903,822 | * 5/1999 | Sekine et al. | 455/89 |

FOREIGN PATENT DOCUMENTS

| | | | |
|---|---|---|---|
| 61-135235 | 6/1986 | (JP) | H04B/1/18 |
| 5-115090 | 5/1993 | (JP) | H04Q/9/00 |
| 7-023450 | 1/1995 | (JP) | H04B/7/26 |
| 9-162618 | 6/1997 | (JP) | H01Q/1/22 |

* cited by examiner

Primary Examiner—Daniel S. Hunter
Assistant Examiner—Meless N Zewdu
(74) Attorney, Agent, or Firm—Scully, Scott, Murphy & Presser

(57) ABSTRACT

In a movable radio terminal device, a switching circuit connects, in response to one of first and second matching switching control signals, an antenna 2 to one of first and second impedance matching circuits. The controlling unit produces and supplies, at every predetermined time interval, the first and second matching switching control signals to the switching circuit, respectively, to make a memory device memorize, as first and second level signals having first and second level values, detected level signals from a level detecting circuit when the switching circuit connects the antenna to the first and second impedance matching circuits, respectively, when the detected level value from the level detecting circuit is smaller than one of the first and second level values that corresponds to the second greatest level value in the first and second level values, and when the controlling unit is supplied with a human body contact discriminating signal from a human body contact discriminating circuit. The controlling unit selects, as a selected level value, one of the first and second level values that is greatest in the first and second level values. The controlling unit produces and supplies one of the first and second matching switching control signals that corresponds to the selected level value to the switching circuit.

6 Claims, 10 Drawing Sheets

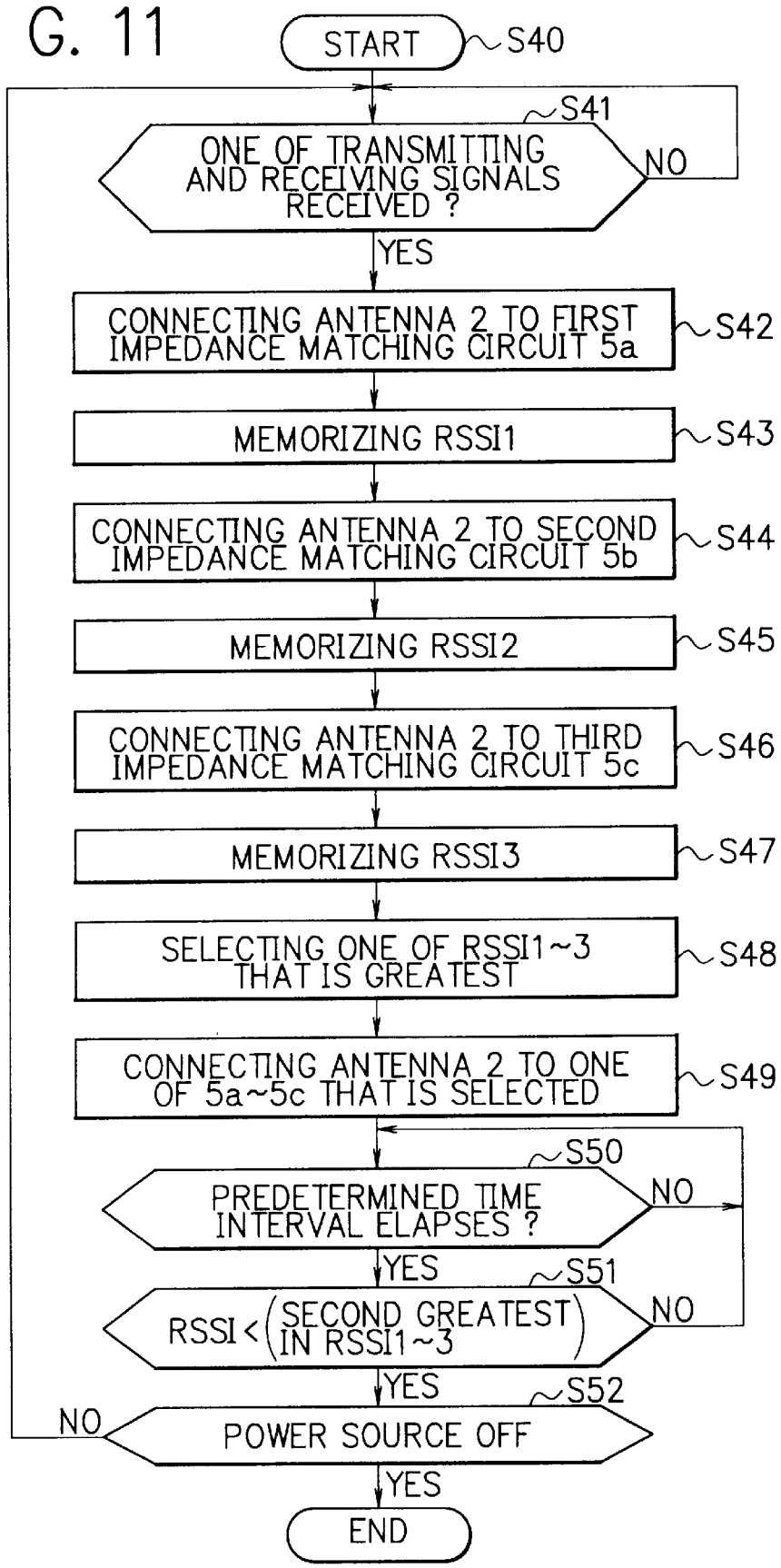

MOVABLE RADIO TERMINAL DEVICE CAPABLE OF PRECISELY MATCHING IMPEDANCES

BACKGROUND OF THE INVENTION

This invention relates to a movable radio terminal device which is capable of matching impedances.

DESCRIPTION OF THE PRIOR ART

A first conventional movable radio terminal device is disclosed in Japanese Unexamined Patent Prepublication (koukai) No. 23450/1995. The first conventional movable radio terminal device comprises an antenna, a radio transmitting and receiving circuit, a controlling circuit, a switching circuit, a stub, and an impedance detecting circuit. The impedance detecting circuit detects a change of an impedance of the antenna to produce an impedance change detecting signal. The controlling circuit makes the switching circuit connect the antenna to the stub so to match impedances of the antenna and an internal circuit.

Also, a second conventional movable radio terminal device is disclosed in Japanese Unexamined Patent Prepublication (koukai) No. 162618/1997. The second conventional movable radio terminal device comprises an antenna, a radio transmitting and receiving circuit, a switching circuit, a matching stub, and a plurality of stubs which are manually moved. When the second conventional movable radio terminal device is in contact with a human body, matching of impedances of the antenna and an internal circuit is executed by manually moving the stubs so that one of the stubs is connected to the matching stub.

Also, a third conventional movable radio terminal device is disclosed in Japanese Unexamined Patent Prepublication (koukai) No. 135235/1986. The third conventional movable radio terminal device comprises an antenna, a level detecting circuit, a controlling circuit, and a variable reactance element. The level detecting circuit detects, in all time, a level of one of receiving and transmitting signal to produce a detected level signal having a level value. When the level value of the detected level signal is smaller than the level value which was previously detected, the controlling circuit controls a reactance value of the variable reactance element so to match impedances of the antenna and an internal circuit.

Also, a fourth conventional movable radio terminal device is disclosed in Japanese Unexamined Patent Prepublication (koukai) No. 115090/1993. The fourth conventional movable radio terminal device comprises a first impedance matching circuit, a second impedance matching circuit, a switching circuit, a human body detecting circuit, and a controlling circuit. The human body detecting circuit detects that a human body exists near the movable radio terminal device to produce a human body detecting signal. When the controlling circuit is not supplied with the human body detecting signal, the controlling circuit makes the switching circuit connect the first impedance matching circuit to the antenna. When the controlling circuit is supplied with the human body detecting signal, the controlling circuit makes the switching circuit connect the second impedance matching circuit to the antenna.

However, each of the conventional movable radio terminal devices is incapable of precisely matching impedances of the antenna and the internal circuit.

SUMMARY OF THE INVENTION

It is therefore an object of this invention to provide a movable radio terminal device which is capable of precisely matching impedances of an antenna and an internal circuit.

Other objects of this invention will become clear as the description proceeds.

According to a first aspect of this invention, there is provided a movable radio terminal device comprising:

an antenna receiving a radio receiving signal to produce a receiving signal, the antenna receiving a transmitting signal to produce a radio transmitting signal;

a level detecting circuit connected to the antenna for detecting a level of one of the receiving signal and the transmitting signal to produce a detected level signal having a detected level value;

first through N-th impedance matching circuits having first through N-th impedances which are different, where N represents an integer greater than one;

a switching circuit connected to the antenna and to the first through N-th impedance matching circuits for connecting, in response to one of first through N-th matching switching control signals, the antenna to one of the first through N-th impedance matching circuits;

a transmitting circuit connected to the transmitting and receiving switching circuit for producing the transmitting signal;

a receiving circuit connected to the transmitting and receiving switching circuit for receiving the receiving signal;

a transmitting and receiving switching circuit connected to the first through N-th impedance matching circuits and to the transmitting and receiving circuits for connecting, in response to transmitting and receiving switching control signals, the first through N-th impedance matching circuits to one of the transmitting and receiving circuits;

a controlling unit connected to the level detecting circuit, to the switching circuit, to the transmitting and receiving switching circuit, and to the transmitting and receiving circuits for producing and supplying the transmitting and receiving switching control signals to the transmitting and receiving switching circuit, respectively;

a human body contact discriminating circuit connected to the controlling unit for discriminating whether or not a human body is contact with the movable radio terminal device to produce and supply a human body contact discriminating signal to the controlling unit when the human body is contact with the movable radio terminal device; and a memory device connected to the controlling unit;

the controlling unit producing and supplying the first matching switching control signal to the switching circuit when the controlling unit is not supplied with the human body contact discriminating signal from the human body contact discriminating circuit, the controlling unit producing and supplying, at every predetermined time interval, the first through N-th matching switching control signals to the switching circuit, respectively, to make the memory device memorize, as first through N-th level signals having first through N-th level values, the detected level signals from the level detecting circuit when the switching circuit connects the antenna to the first through N-th impedance matching circuits, respectively, and when the controlling unit is supplied with the human body contact discriminating signal from the human body contact discriminating circuit, the controlling unit selecting, as a selected level value, one of the first through N-th level values that is greatest in the first through N-th level values, the controlling unit producing and supplying one of the first through N-th matching switching control signals that corresponds to the selected level value to the switching circuit.

According to a second aspect of this invention, there is provided a movable radio terminal device comprising:

an antenna receiving a radio receiving signal to produce a receiving signal, the antenna receiving a transmitting signal to produce a radio transmitting signal;

a level detecting circuit connected to the antenna for detecting a level of one of the receiving signal and the transmitting signal to produce a detected level signal having a detected level value;

first through N-th impedance matching circuits having first through N-th impedances which are different, where N represents an integer greater than one;

a switching circuit connected to the antenna and to the first through N-th impedance matching circuits for connecting, in response to one of first through N-th matching switching control signals, the antenna to one of the first through N-th impedance matching circuits;

a transmitting circuit connected to the transmitting and receiving switching circuit for producing the transmitting signal;

a receiving circuit connected to the transmitting and receiving switching circuit for receiving the receiving signal;

a transmitting and receiving switching circuit connected to the first through N-th impedance matching circuits and to the transmitting and receiving circuits for connecting, in response to transmitting and receiving switching control signals, the first through N-th impedance matching circuits to one of the transmitting and receiving circuits;

a controlling unit connected to the level detecting circuit, to the switching circuit, to the transmitting and receiving switching circuit, and to the transmitting and receiving circuits for producing and supplying the transmitting and receiving switching control signals to the transmitting and receiving switching circuit, respectively;

a human body contact discriminating circuit connected to the controlling unit for discriminating whether or not a human body is contact with the movable radio terminal device to produce and supply a human body contact discriminating signal to the controlling unit when the human body is contact with the movable radio terminal device; and a memory device connected to the controlling unit;

the controlling unit producing and supplying the first matching switching control signal to the switching circuit when the controlling unit is not supplied with the human body contact discriminating signal from the human body contact discriminating circuit, the controlling unit producing and supplying, at every predetermined time interval, the first through N-th matching switching control signals to the switching circuit, respectively, to make the memory device memorize, as first through N-th level signals having first through N-th level values, the detected level signals from the level detecting circuit when the switching circuit connects the antenna to the first through N-th impedance matching circuits, respectively, when the detected level value from the level detecting circuit is smaller than one of the first through N-th level values that corresponds to the second greatest level value in the first through N-th level values, and when the controlling unit is supplied with the human body contact discriminating signal from the human body contact discriminating circuit, the controlling unit selecting, as a selected level value, one of the first through N-th level values that is greatest in the first through N-th level values, the controlling unit producing and supplying one of the first through N-th matching switching control signals that corresponds to the selected level value to the switching circuit.

According to a third aspect of this invention, there is provided a movable radio terminal device comprising:

an antenna receiving a radio receiving signal to produce a receiving signal, the antenna receiving a transmitting signal to produce a radio transmitting signal;

a level detecting circuit connected to the antenna for detecting a level of one of the receiving signal and the transmitting signal to produce a detected level signal having a detected level value;

first through N-th impedance matching circuits having first through N-th impedances which are different, where N represents an integer greater than one;

a switching circuit connected to the antenna and to the first through N-th impedance matching circuits for connecting, in response to one of first through N-th matching switching control signals, the antenna to one of the first through N-th impedance matching circuits;

a transmitting circuit connected to the transmitting and receiving switching circuit for producing the transmitting signal;

a receiving circuit connected to the transmitting and receiving switching circuit for receiving the receiving signal;

a transmitting and receiving switching circuit connected to the first through N-th impedance matching circuits and to the transmitting and receiving circuits for connecting, in response to transmitting and receiving switching control signals, the first through N-th impedance matching circuits to one of the transmitting and receiving circuits;

a controlling unit connected to the level detecting circuit, to the switching circuit, to the transmitting and receiving switching circuit, and to the transmitting and receiving circuits for producing and supplying the transmitting and receiving switching control signals to the transmitting and receiving switching circuit, respectively;

a human body contact discriminating circuit connected to the controlling unit for discriminating whether or not a human body is contact with the movable radio terminal device to produce and supply a human body contact discriminating signal to the controlling unit when the human body is contact with the movable radio terminal device; and a memory device connected to the controlling unit;

the controlling unit producing and supplying the first matching switching control signal to the switching circuit when the controlling unit is not supplied with the human body contact discriminating signal from the human body contact discriminating circuit, the controlling unit producing and supplying, at every predetermined time interval, the first through N-th matching switching control signals to the switching circuit, respectively, to make the memory device memorize, as first through N-th level signals having first through N-th level values, the detected level signals from the level detecting circuit when the switching circuit connects the antenna to the first through N-th impedance matching circuits, respectively, when the detected level value from the level detecting circuit is smaller than a reference level value, and when the controlling unit is supplied with the human body contact discriminating signal from the human body contact discriminating circuit, the controlling unit selecting, as a selected level value, one of the first through N-th level values that is greatest in the first through N-th level values, the controlling unit producing and supplying one of the first through N-th matching switching control signals that corresponds to the selected level value to the switching circuit.

According to a fourth aspect of this invention, there is provided a movable radio terminal device comprising:

an antenna receiving a radio receiving signal to produce a receiving signal, the antenna receiving a transmitting signal to produce a radio transmitting signal;

a level detecting circuit connected to the antenna for detecting a level of one of the receiving signal and the transmitting signal to produce a detected level signal having a detected level value;

first through N-th impedance matching circuits having first through N-th impedances which are different, where N represents an integer greater than one;

a switching circuit connected to the antenna and to the first through N-th impedance matching circuits for connecting, in response to one of first through N-th matching switching control signals, the antenna to one of the first through N-th impedance matching circuits;

a transmitting circuit connected to the transmitting and receiving switching circuit for producing the transmitting signal;

a receiving circuit connected to the transmitting and receiving switching circuit for receiving the receiving signal;

a transmitting and receiving switching circuit connected to the first through N-th impedance matching circuits and to the transmitting and receiving circuits for connecting, in response to transmitting and receiving switching control signals, the first through N-th impedance matching circuits to one of the transmitting and receiving circuits;

a controlling unit connected to the level detecting circuit, to the switching circuit, to the transmitting and receiving switching circuit, and to the transmitting and receiving circuits for producing and supplying the transmitting and receiving switching control signals to the transmitting and receiving switching circuit, respectively; and a memory device connected to the controlling unit;

the controlling unit producing and supplying, at every predetermined time interval, the first through N-th matching switching control signals to the switching circuit, respectively, to make the memory device memorize, as first through N-th level signals having first through N-th level values, the detected level signals from the level detecting circuit when the switching circuit connects the antenna to the first through N-th impedance matching circuits, respectively, the controlling unit selecting, as a selected level value, one of the first through N-th level values that is greatest in the first through N-th level values, the controlling unit producing and supplying one of the first through N-th matching switching control signals that corresponds to the selected level value to the switching circuit.

According to a fifth aspect of this invention, there is provided a movable radio terminal device comprising:

an antenna receiving a radio receiving signal to produce a receiving signal, the antenna receiving a transmitting signal to produce a radio transmitting signal;

a level detecting circuit connected to the antenna for detecting a level of one of the receiving signal and the transmitting signal to produce a detected level signal having a detected level value;

first through N-th impedance matching circuits having first through N-th impedances which are different, where N represents an integer greater than one;

a switching circuit connected to the antenna and to the first through N-th impedance matching circuits for connecting, in response to one of first through N-th matching switching control signals, the antenna to one of the first through N-th impedance matching circuits;

a transmitting circuit connected to the transmitting and receiving switching circuit for producing the transmitting signal;

a receiving circuit connected to the transmitting and receiving switching circuit for receiving the receiving signal;

a transmitting and receiving switching circuit connected to the first through N-th impedance matching circuits and to the transmitting and receiving circuits for connecting, in response to transmitting and receiving switching control signals, the first through N-th impedance matching circuits to one of the transmitting and receiving circuits;

a controlling unit connected to the level detecting circuit, to the switching circuit, to the transmitting and receiving switching circuit, and to the transmitting and receiving circuits for producing and supplying the transmitting and receiving switching control signals to the transmitting and receiving switching circuit, respectively; and a memory device connected to the controlling unit;

the controlling unit producing and supplying, at every predetermined time interval, the first through N-th matching switching control signals to the switching circuit, respectively, to make the memory device memorize, as first through N-th level signals having first through N-th level values, the detected level signals from the level detecting circuit when the switching circuit connects the antenna to the first through N-th impedance matching circuits, respectively, when the detected level value from the level detecting circuit is smaller than one of the first through N-th level values that corresponds to the second greatest level value in the first through N-th level values, the controlling unit selecting, as a selected level value, one of the first through N-th level values that is greatest in the first through N-th level values, the controlling unit producing and supplying one of the first through N-th matching switching control signals that corresponds to the selected level value to the switching circuit.

According to a sixth aspect of this invention, there is provided a movable radio terminal device comprising:

an antenna receiving a radio receiving signal to produce a receiving signal, the antenna receiving a transmitting signal to produce a radio transmitting signal;

a level detecting circuit connected to the antenna for detecting a level of one of the receiving signal and the transmitting signal to produce a detected level signal having a detected level value;

first through N-th impedance matching circuits having first through N-th impedances which are different, where N represents an integer greater than one;

a switching circuit connected to the antenna and to the first through N-th impedance matching circuits for connecting, in response to one of first through N-th matching switching control signals, the antenna to one of the first through N-th impedance matching circuits;

a transmitting circuit connected to the transmitting and receiving switching circuit for producing the transmitting signal;

a receiving circuit connected to the transmitting and receiving switching circuit for receiving the receiving signal;

a transmitting and receiving switching circuit connected to the first through N-th impedance matching circuits and to the transmitting and receiving circuits for connecting, in response to transmitting and receiving switching control signals, the first through N-th impedance matching circuits to one of the transmitting and receiving circuits;

a controlling unit connected to the level detecting circuit, to the switching circuit, to the transmitting and receiving switching circuit, and to the transmitting and receiving circuits for supplying the transmitting and receiving switching control signals to the transmitting and receiving switching circuit, respectively; and a memory device connected to the controlling unit;

the controlling unit producing and supplying, at every predetermined time interval, the first through N-th matching switching control signals to the switching circuit, respectively, to make the memory device memorize, as first through N-th level signals having first through N-th level values, the detected level signals from the level detecting circuit when the switching circuit connects the antenna to the first through N-th impedance matching circuits, respectively, when the detected level value from the level detecting circuit is smaller than a reference level value, the controlling unit selecting, as a selected level value, one of the first through N-th level values that is greatest in the first through N-th level values, the controlling unit producing and supplying one of the first through N-th matching switching control signals that corresponds to the selected level value to the switching circuit.

BRIEF DESCRIPTION OF THE DRAWINGS

FIG. 11 is a flow chart for use in describing an operation of the movable radio terminal device illustrated in FIG. 10.

DESCRIPTION OF THE PREFERRED EMBODIMENTS

Figure 1:
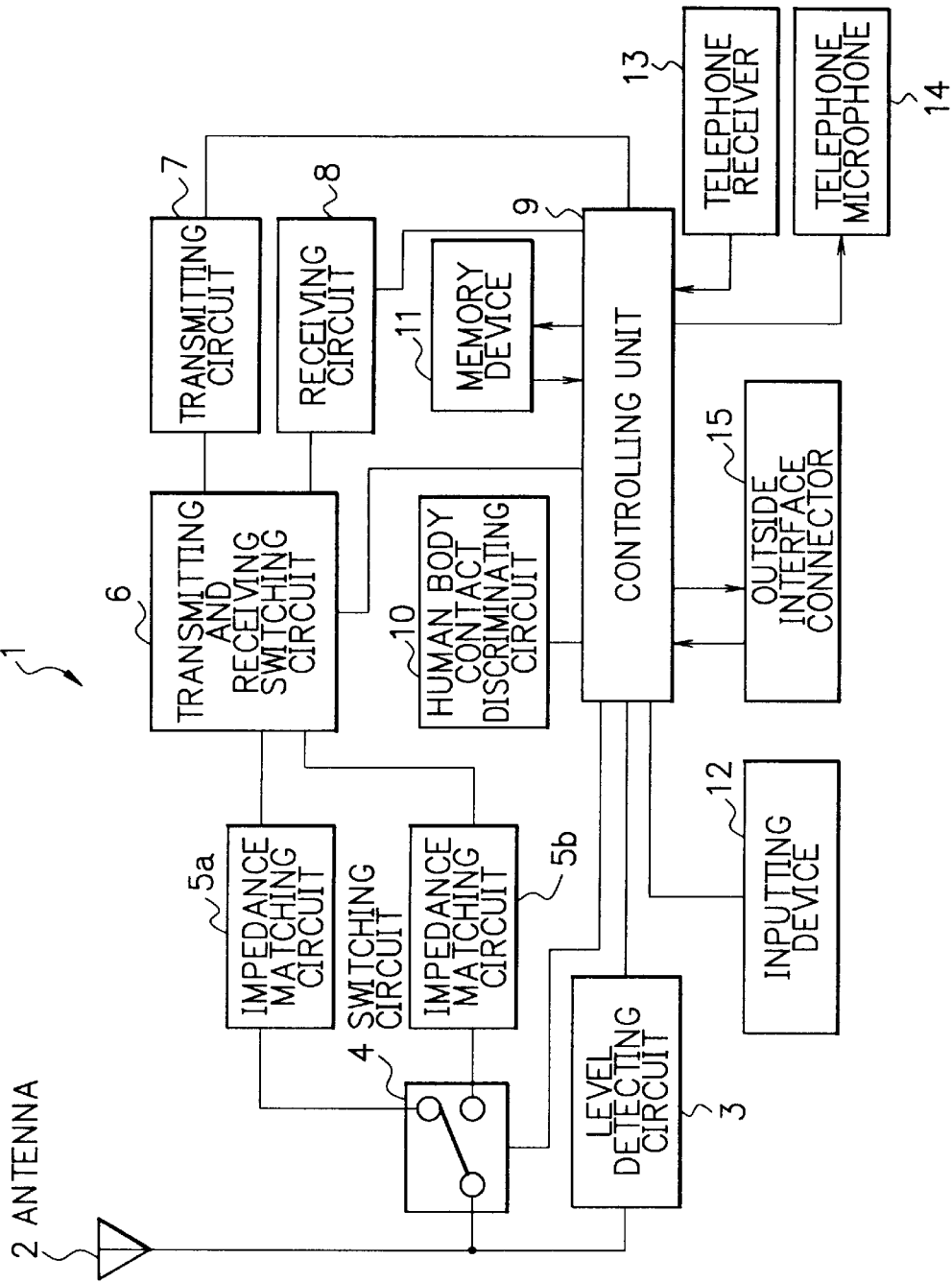
FIG. 1 is a block diagram of a movable radio terminal device according to a first embodiment of this invention.

FIGS. 1, 2, 3, 4, 5, and 6, a movable radio terminal device according to a first embodiment of this invention will be described. In FIG. 1, the movable radio terminal device 1 comprises a antenna 2, a level detecting circuit 3, a switching circuit 4, first and second impedance matching circuits 5a and 5b, a transmitting and receiving switching circuit 6, a transmitting circuit 7, a receiving circuit 8, a controlling unit 9, a human body contact discriminating circuit 10, a memory device 11, an inputting device 12, a telephone receiver 13, a telephone microphone 14, and an outside interface connector 15.

The level detecting circuit 3 is connected to the antenna 2. The switching circuit 4 is connected to the antenna 2. The impedance matching circuits 5a and 5b are connected to the switching circuit 4. The transmitting and receiving switching circuit 6 is connected to the impedance matching circuits 5a and 5b. The transmitting circuit 7 and the receiving circuit 8 are connected to the transmitting and receiving switching circuit 6. The controlling unit 9 is connected to the level detecting circuit 3, to the switching circuit 4, to the transmitting and receiving switching circuit 6, to the transmitting circuit 7, to the receiving circuit 8, to the human body contact discriminating circuit 10, to the memory device 11, to the inputting device 12, to the telephone receiver 13, to the telephone microphone 14, and to the outside interface connector 15.

The antenna 2 receives a radio receiving signal to produce a receiving signal. Also, the antenna 2 receives a transmitting signal to produce a radio transmitting signal. The level detecting circuit 3 detects a level of one of the receiving signal and the transmitting signal to produce a detected level signal having a detected level value. The level of the one of the receiving signal and the transmitting signal corresponds to a received signal strength indicator (RSSI) level. The level detecting circuit 3 supplies the detected level signal to the controlling unit 9. The first and second impedance matching circuits 5a and 5b have first and second impedances which are different.

The switching circuit 4 connects, in response to one of first and second matching switching control signals from the controlling unit 9, the antenna 2 to one of the first and second impedance matching circuits 5a and 5b. The transmitting circuit 7 produces and supplies the transmitting signal to the transmitting and receiving switching circuit 6. The receiving circuit 8 receives the receiving signal.

The transmitting and receiving switching circuit 6 connects, in response to a transmitting switching control signal from the controlling unit 9, the first and second impedance matching circuits 5a and 5b to the transmitting circuit 7. The transmitting circuit 7 supplies the transmitting signal to the antenna 2 through the transmitting and receiving switching circuit 6, one of the first and second impedance matching circuits 5a and 5b, and the switching circuit 4. The transmitting and receiving switching circuit 6 connects, in response to a receiving switching control signal from the controlling unit 9, the first and second impedance matching circuits 5a and 5b to the receiving circuits 8. The receiving circuit 8 receives the receiving signal from the antenna 2 through the transmitting and receiving switching circuit 6, one of the first and second impedance matching circuits 5a and 5b, and the switching circuit 4.

The human body contact discriminating circuit 10 discriminates whether or not a human body is contact with the movable radio terminal device 1 to produce and supply a human body contact discriminating signal to the controlling unit 9 when the human body is contact with the movable radio terminal device 1. The memory device 11 memorizes first and second level signals having first and second level values from the controlling unit 9.

The controlling unit 9 produces and supplies the one of the transmitting and receiving switching control signals to the transmitting and receiving switching circuit 6. The controlling unit 9 produces and supplies the first matching switching control signal to the switching circuit 4 when the controlling unit 9 is not supplied with the human body contact discriminating signal from the human body contact discriminating circuit 10. The controlling unit 9 produces and supplies, at every predetermined time interval, the first and second matching switching control signals to the switching circuit 4, respectively, to make the memory device 10 memorize, as the first and second level signals having the first and second level values, the detected level signals from the level detecting circuit 3 when the switching circuit 4 connects the antenna 2 to the first and second impedance matching circuits 5a and 5b, respectively, when the detected level value from the level detecting circuit is smaller than one of the first and second level values that corresponds to the second greatest level value in the first and second level values of the first and second level signals from the memory device 11, and when the controlling unit 9 is supplied with the human body contact discriminating signal from the human body contact discriminating circuit 10.

The controlling unit 9 selects, as a selected level value, one of the first and second level values that is greatest in the first and second level values. The controlling unit 9 produces one of the first and second matching switching control signals that corresponds to the selected level value.

Here, each of the first and second impedance matching circuits 5a and 5b operates so that an impedance from a side of the antenna 2 is equal to an impedance from a side of the transmitting and receiving switching circuit 6.

Figure 2:
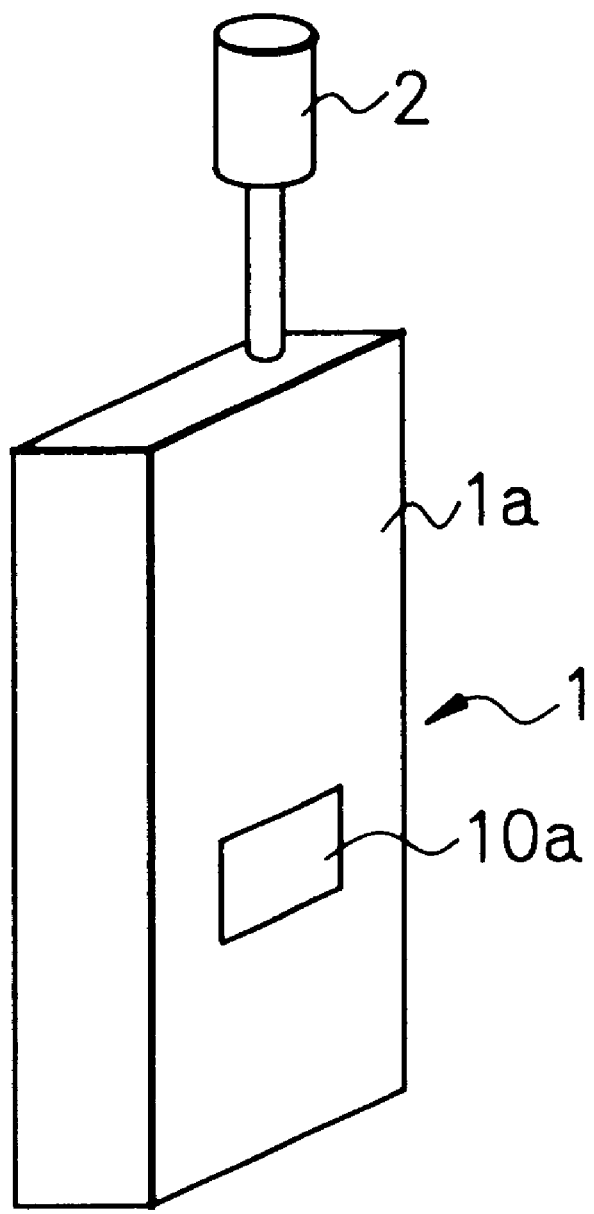
FIG. 2 is a schematic perspective view of the movable radio terminal device illustrated in FIG. 1.

As shown in FIG. 2, the human body contact discriminating circuit 10 comprises an electrode plate 10a and an electric current detecting circuit (not shown). The electrode plate 10a is mounted on a surface of a body 1a of the movable radio terminal device 1. The electric current detecting circuit is connected to the electrode plate 10a. The electric current detecting circuit detects an electric current which flows when the human body is contact with the electrode plate 10a of the movable radio terminal device 1. In addition, the human body contact discriminating circuit 10 may comprise a temperature detecting element.

The inputting device 12 is implemented by such as ten keys and other operating keys. The inputting device 12 is capable of inputting numbers and values. The telephone receiver 13 receives a voice signal. The telephone microphone 14 transmits the voice signal. The outside interface connector 15 is for connecting such as an earphone to the movable radio terminal device 1.

Figure 3:
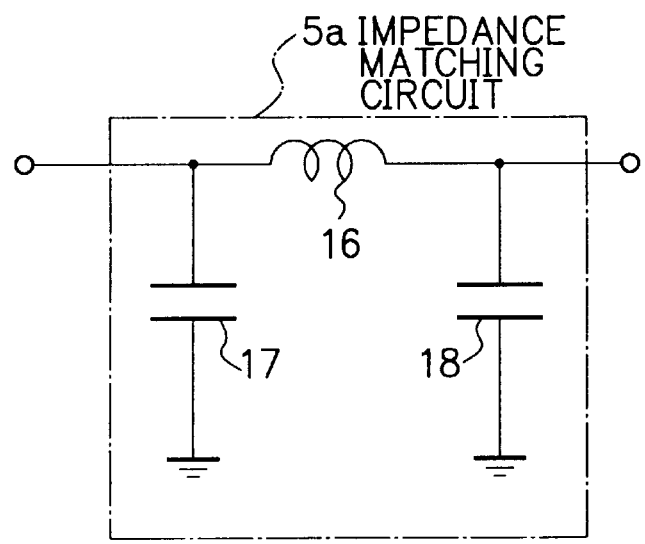
FIG. 3 is a circuit diagram of a first impedance matching circuit of the movable radio terminal device illustrated in FIG. 1.

As shown in FIG. 3, the first impedance matching circuit 5a comprises a first coil 16, a first capacitor 17, and a second capacitor 18. The first coil 16 is, in series, connected between the switching circuit 4 and the transmitting and receiving switching circuit 6. The first capacitor 17 is connected between a node of the switching circuit 4 and the first coil 16 and the ground. The second capacitor 18 is connected between a node of the transmitting and receiving switching circuit 6 and the first coil 16 and the ground. Namely, the first impedance matching circuit 5a is an impedance matching circuit of the π type. The first coil 16 has an first inductance L1. The first capacitor 17 has a first capacity C1. The second capacitor 18 has a second capacity C2.

Figure 4:
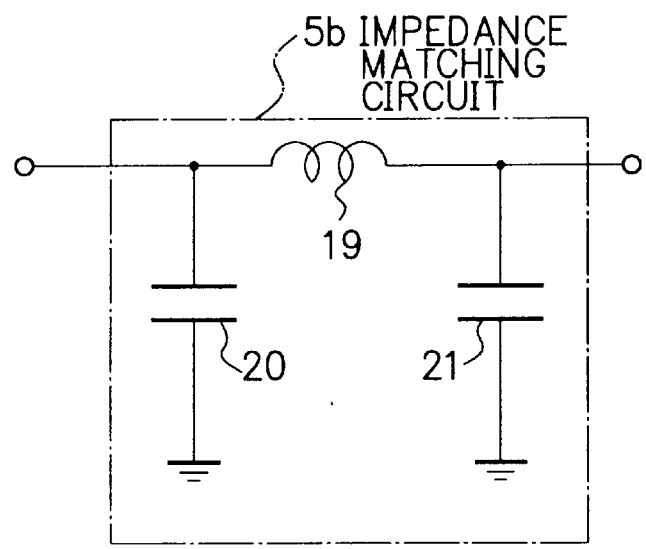
FIG. 4 is a circuit diagram of a second impedance matching circuit of the movable radio terminal device illustrated in FIG. 1.

As shown in FIG. 4, the second impedance matching circuit 5b comprises a second coil 19, a third capacitor 20, and a fourth capacitor 21. The second coil 19 is, in series, connected between the switching circuit 4 and the transmitting and receiving switching circuit 6. The third capacitor 17 is connected between a node of the switching circuit 4 and the second coil 19 and the ground. The fourth capacitor 21 is connected between a node of the transmitting and receiving switching circuit 6 and the second coil 19 and the ground. Namely, the second impedance matching circuit 5b is an impedance matching circuit of the π type. The second coil 19 has a second inductance L2. The third capacitor 20 has a third capacity C3. The fourth capacitor 21 has a fourth capacity C4.

It is possible to change a first impedance of the first impedance matching circuit 5a by changing the first inductance L1, the first capacity C1, and the second capacity C2. Also, it is possible to change a second impedance of the second impedance matching circuit 5b by changing the second inductance L2, the third capacity C3, and the fourth capacity C4. In addition, a constitution of the first impedance matching circuit 5a may be not same to a constitution of the second impedance matching circuit 5b.

Figure 5:
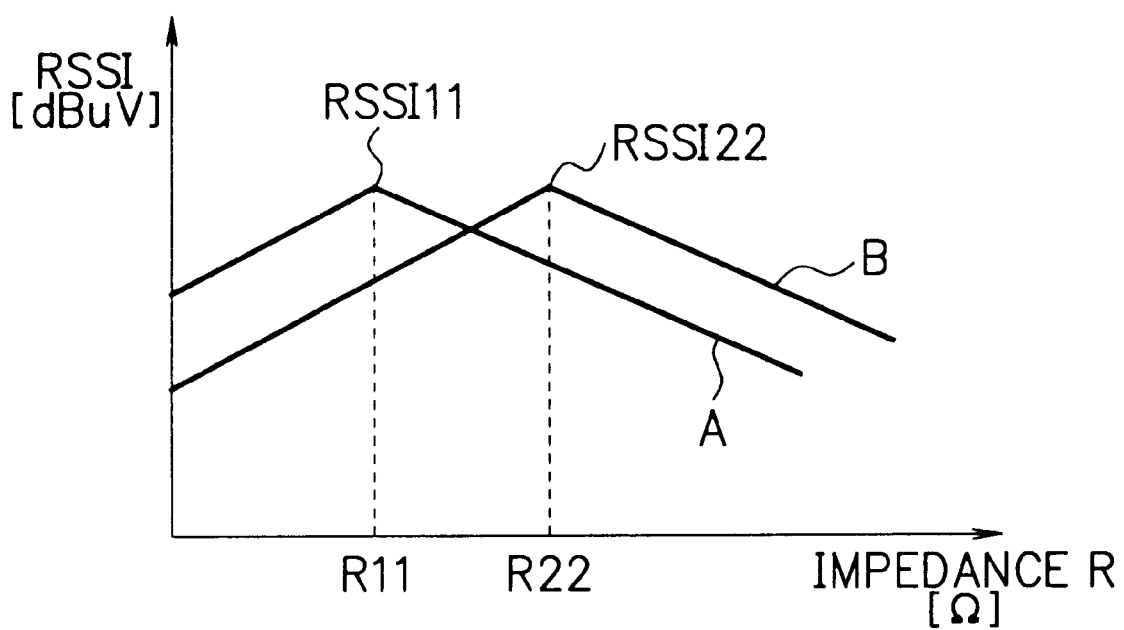
FIG. 5 is a view for use in describing an operation of the movable radio terminal device illustrated in FIG. 1.

FIG. 5 shows a relation between an impedance from to the antenna 2 and the RSSI level, namely, the level of the one of the receiving signal and the transmitting signal. In FIG. 5, an axis of abscissa represents the impedance R (Ω) and an axis of ordinates represents the RSSI level (dBuV). A line A represents the RSSI level in case that the human body is in contact with the movable radio terminal device 1. A line B represents the RSSI level in case that the human body is not in contact with the movable radio terminal device 1. In case that the human body is in contact with the movable radio terminal device 1, the RSSI level becomes a RSSI11 which is a maximum value when the impedance is equal to R11. In case that the human body is not in contact with the movable radio terminal device 1, the RSSI level becomes a RSSI22 which is a maximum value when the impedance is equal to R22.

Generally, each of the RSSI11 and RSSI22 is equal to about 60 dBuV. An upper limit value of the RSSI level falls when a receiving sensitivity is decreased by an ambient environment. Namely, each of the RSSI11 and RSSI22 is equal to about 60 dBuV when the receiving sensitivity is most favorable. Generally, the upper limit value of the RSSI level falls in an actual ambient environment. Therefore, changing mount of the impedance of the antenna is equal to (R22–R11) so that the RSSI level becomes to a most favorable when the human body becomes in contact with the movable radio terminal device 1.

Thus, the impedance R which is able to obtain the RSSI level having a greatest value is, in a large, changed when the human body becomes in contact with the movable radio terminal device 1. Also, the impedance R which is able to obtain the RSSI level having the greatest value is changed regardless of contact of the human body and the movable radio terminal device 1.

Figure 6:
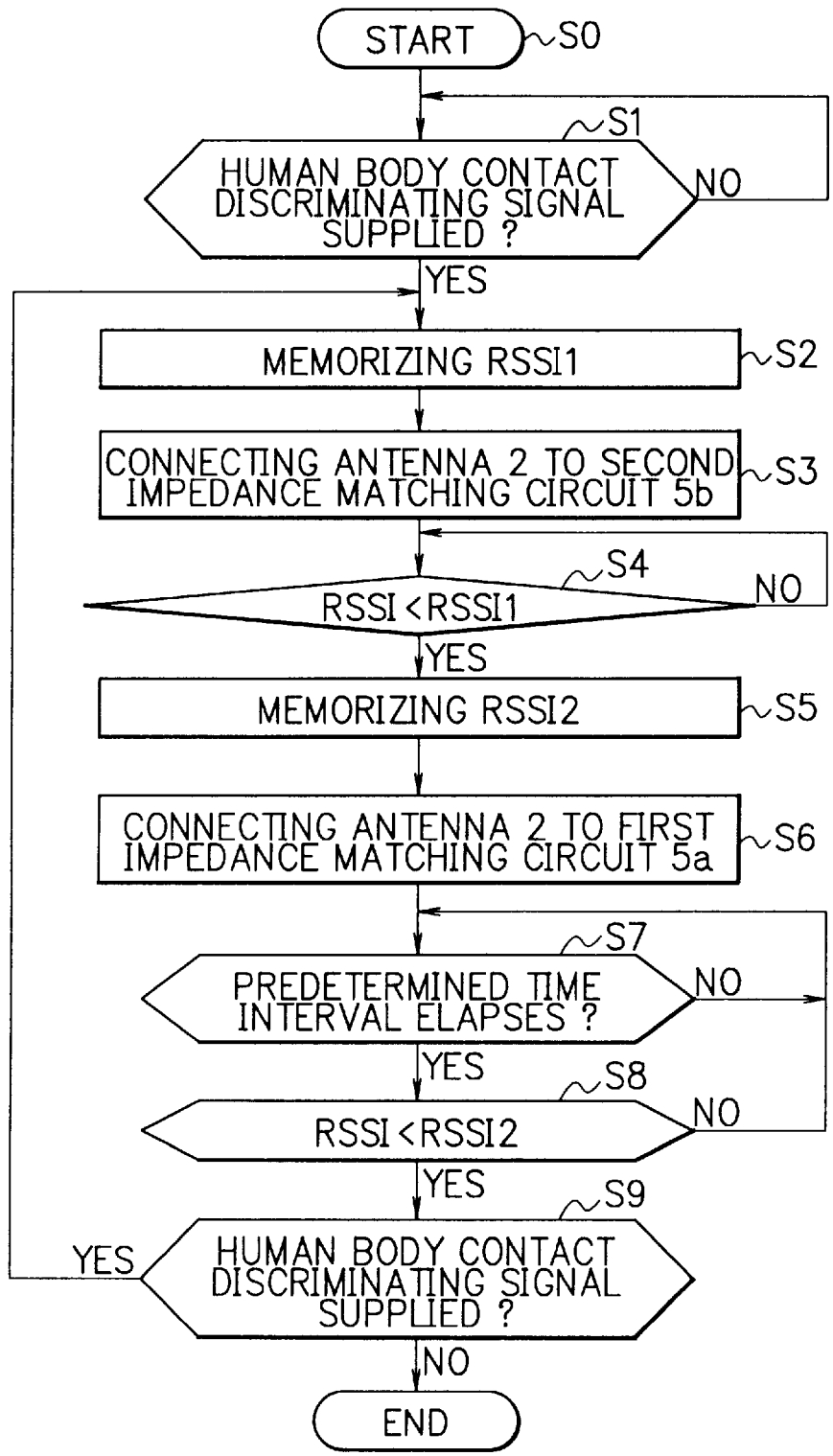
FIG. 6 is a flow chart for use in describing the operation of the movable radio terminal device illustrated in FIG. 1.

Referring to FIG. 6 together with FIG. 1, an operation of the movable radio terminal device 1 will be described in detail.

At a start step S0, the controlling unit 9 produces and supplies the first matching switching control signal to the switching circuit 4. In this event, the switching circuit 4 connects the antenna 2 to the first impedance matching circuit 5a. At a step S1, the controlling unit 9 judges whether or not the controlling unit 9 is supplied with the human body contact discriminating signal. When the controlling unit 9 is supplied with the human body contact discriminating signal, the step S1 proceeds to a step S2. Otherwise, the step S1 is repeated again. At the step S2, the controlling unit 9 makes the memory device 11 memorize, as the first level signal having the first level value, namely, the RSSI1, the detected level signal from the level detecting circuit 3.

The step S2 proceeds to a step S3 at which the controlling unit 9 produces and supplies the second matching switching control signal to the switching circuit 4. In this event, the switching circuit 4 connects the antenna 2 to the second impedance matching circuit 5b. The step S3 proceeds to a step S4 at which the controlling unit 9 judges whether or not the RSSI is smaller than the RSSI1. When the RSSI is smaller than the RSSI1, the step S4 proceeds to a step S5. Otherwise, the stage S4 is repeated again. At the step S5, the controlling unit 9 makes the memory device 11 memorize, as the second level signal having the second level value, namely, the RSSI2, the detected level signal from the level detecting circuit 3.

The step S5 proceeds to a step S6 at which the controlling unit 9 produces and supplies the first matching switching control signal to the switching circuit 4. In this event, the switching circuit 4 connects the antenna 2 to the first impedance matching circuit 5a. The step S6 proceeds to a step S7 at which the controlling unit 9 judges whether or not a predetermined time interval elapses. When the predetermined time interval elapses, the step S7 proceeds to a step S8. At the step S8, the controlling unit 9 judges whether or not the RSSI is smaller than the RSSI2. When the RSSI is smaller than the RSSI2, the step S8 proceeds to a step S9. Otherwise, the step S8 returns to the step S7. At the step S9, the controlling unit 9 judges whether or not the controlling unit 9 is supplied with the human body contact discriminating signal. When the controlling unit 9 is supplied with the human body contact discriminating signal, the step S9 returns to the step S2. Otherwise, the operation is ended.

Figure 7:
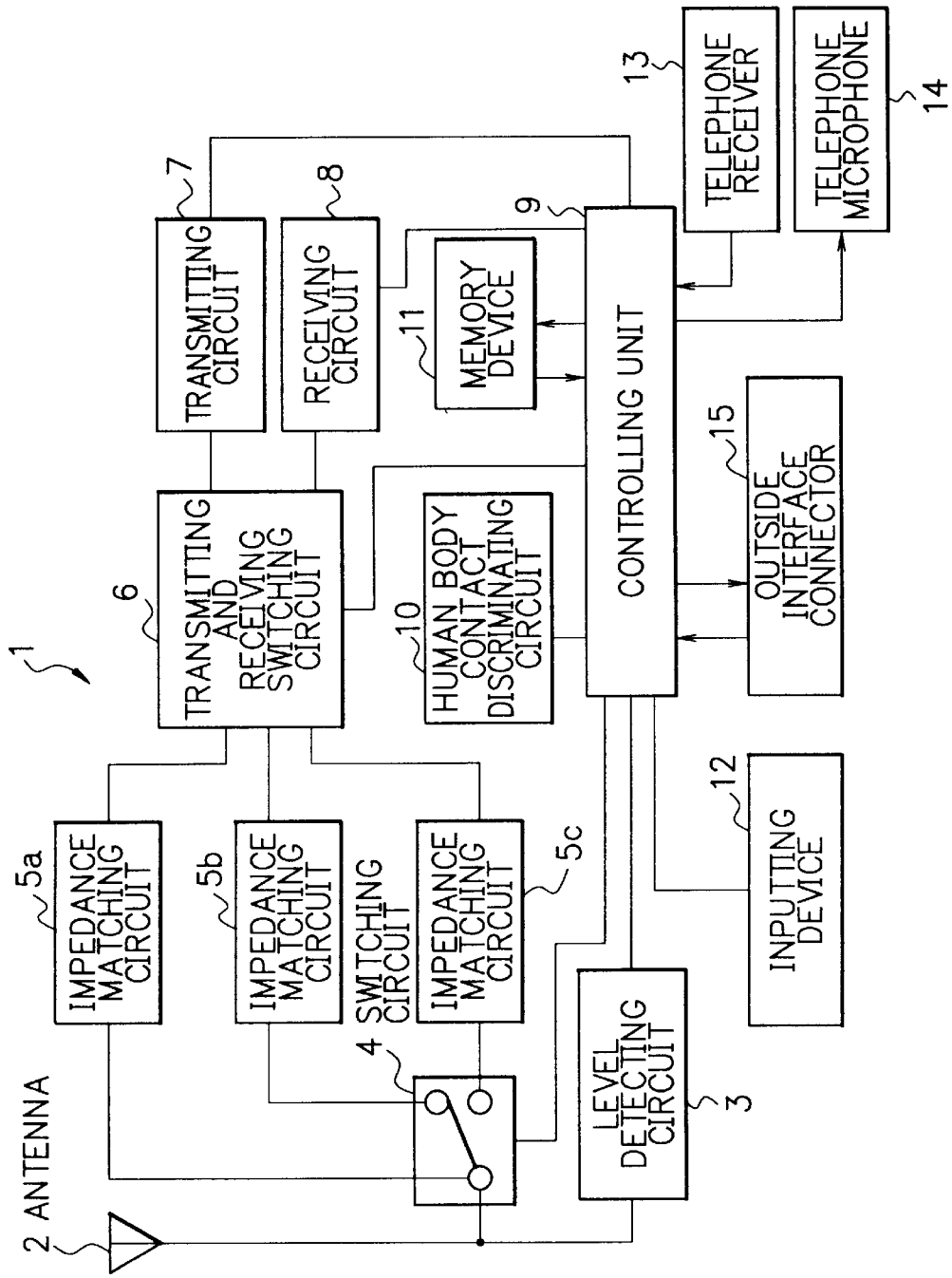
FIG. 7 is a block diagram of a movable radio terminal device according to a second embodiment of this invention.
Figure 8:
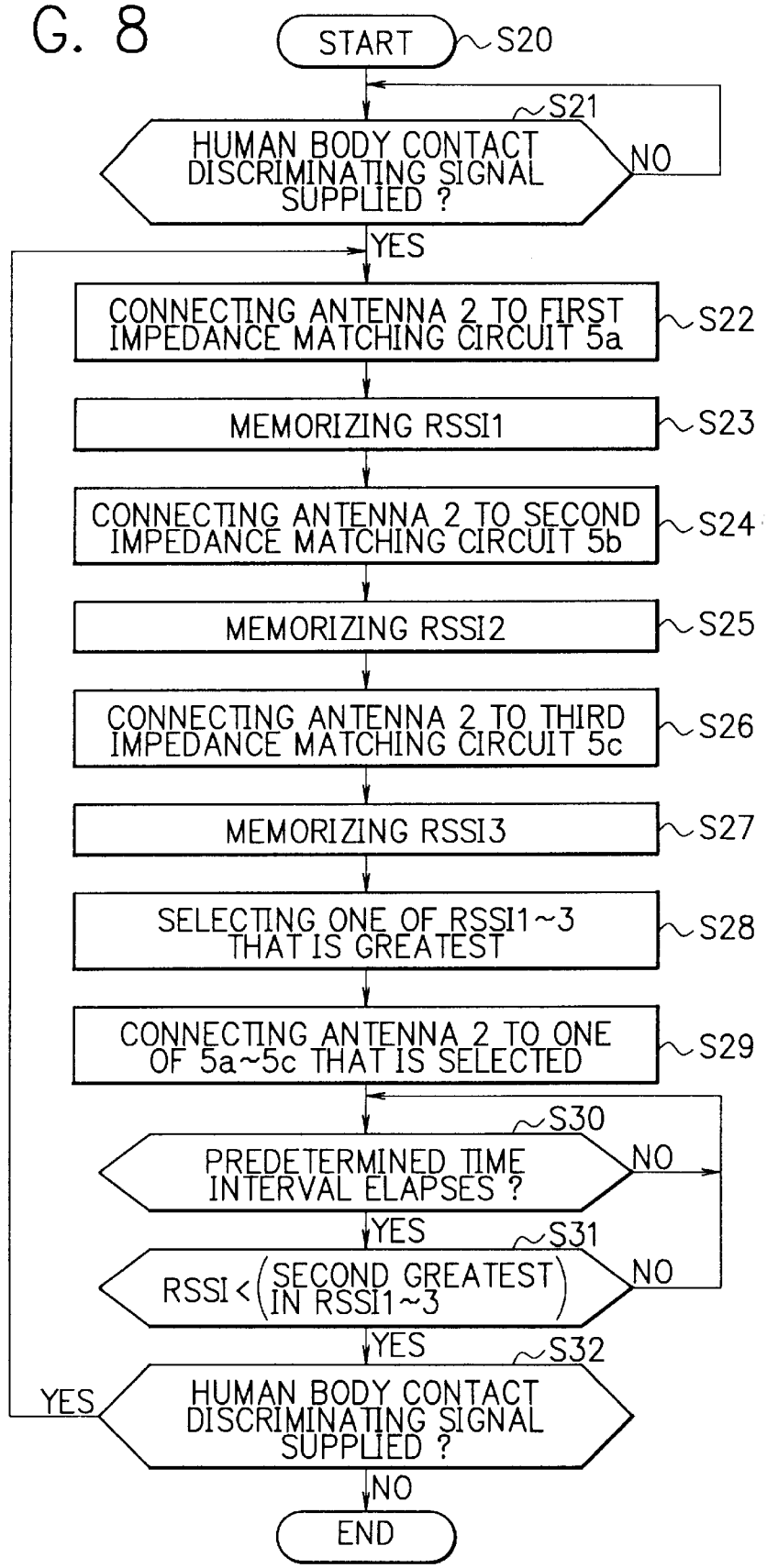
FIG. 8 is a flow chart for use in describing an operation of the movable radio terminal device illustrated in FIG. 7.

FIGS. 7 and 8, a movable radio terminal device according to a second embodiment of this invention will be describe d. Similar parts are designated by like reference numerals, In FIG. 7, the movable radio terminal device 1 comprises the antenna 2, the level detecting circuit 3, the switching circuit 4, the first and second impedance matching circuits 5a and 5b, the transmitting and receiving switching circuit 6, the transmitting circuit 7, the receiving circuit 8, the controlling unit 9, the human body contact discriminating circuit 10, the memory device 11, the inputting device 12, the telephone receiver 13, the telephone microphone 14, and the outside interface connector 15. The movable radio terminal device 1 further comprises a third impedance matching circuit 5c.

The third impedance matching circuits 5c is connected to the switching circuit 4 and to the transmitting and receiving switching circuit 6. The third impedance matching circuits 5c has a third impedance which is different from the first and second impedances. The controlling unit 9 produces and supplies a third matching switching control signal to the switching circuit 4. The switching circuit 4 connects the antenna 2 to the third impedance matching circuits 5c when the switching circuit 4 is supplied with the third matching switching control signal from the controlling unit 9. The controlling unit 9 makes the memory device 11 memorize, as a third level signal having a third level value, the detected level signal from the level detecting circuit 3 when the switching circuit 4 connects the antenna 2 to the third impedance matching circuits 5c.

The controlling unit 9 produces and supplies the first matching switching control signal to the switching circuit when the controlling unit 9 is not supplied with the human body contact discriminating signal from the human body contact discriminating circuit 10. The controlling unit 9 produces and supplies, at every predetermined time interval, the first through third matching switching control signals to the switching circuit 4, respectively, to make the memory device 10 memorize, as the first through third level signals having the first through third level values, the detected level signals from the level detecting circuit 3 when the switching circuit 4 connects the antenna 2 to the first through third impedance matching circuits 5a to 5c, respectively, when the detected level value from the level detecting circuit 3 is smaller than one of the first through third level values that corresponds to the second greatest level value in the first through third level values of the first through third level signals from the memory device 11, and when the controlling unit 9 is supplied with the human body contact discriminating signal from the human body contact discriminating circuit 10.

The controlling unit 9 selects, as a selected level value, one of the first through third level values that is greatest in the first through third level values. The controlling unit 9 produces and supplies one of the first through third matching switching control signals that corresponds to the selected level value to the switching circuit 4.

Referring to FIG. 8 together with FIG. 7, an operation of the movable radio terminal device 1 will be described in detail.

At a start step S20, a power source (not shown) of the movable radio terminal device 1 is set at ON. At a step S21, the controlling unit 9 judges whether or not the controlling unit 9 is supplied with the human body contact discriminating signal. When the controlling unit 9 is supplied with the human body contact discriminating signal, the step S21 proceeds to a step S22. Otherwise, the step S21 is repeated again. At the step S22, the controlling unit 9 produces and supplies the first matching switching control signal to the switching circuit 4. Thereby, the switching circuit 4 connects the antenna 2 to the first impedance matching circuit 5a. The step S22 proceeds to a step S23 at which the controlling unit 9 makes the memory device 11 memorize, as the first level signal having the first level value, namely, the RSSI1, the detected level signal from the level detecting circuit 3.

The step S23 proceeds to a step S24 at which the controlling unit 9 produces and supplies the second matching switching control signal to the switching circuit 4. Thereby, the switching circuit 4 connects the antenna 2 to the second impedance matching circuit 5b. The step S24 proceeds to a step S25 at which the controlling unit 9 makes the memory device 11 memorize, as the second level signal having the second level value, namely, the RSSI2, the detected level signal from the level detecting circuit 3.

The step S25 proceeds to a step S26 at which the controlling unit 9 produces and supplies the third matching switching control signal to the switching circuit 4. Thereby, the switching circuit 4 connects the antenna 2 to the third impedance matching circuit 5c. The step S26 proceeds to a step S27 at which the controlling unit 9 makes the memory device 11 memorize, as the third level signal having the third level value, namely, the RSSI3, the detected level signal from the level detecting circuit 3.

The step S27 proceeds to a step S28 at which the controlling unit 9 reads the SSI1, SSI2, and RSSI3 from the memory device 11 to select, as a selected level value, one of the SSI1, SSI2, and RSSI3 that is greatest in the SSI1, SSI2, and RSSI3. The step S28 proceeds to a step S29 at which the controlling unit 9 produces and supplies one of the first through third matching switching control signals that corresponds to the selected level value to the switching circuit 4. In this even t, the switching circuit 4 connects, in response to the one of the first through third matching switching control signals that corresponds to the selected level value, the antenna 2 to one of the first through third impedance matching circuits 5a to 5c that corresponds to the selected level value.

The step S29 proceeds to a step S30 at which the controlling unit 9 judges whether or not a predetermined time interval elapses. When the predetermined time interval elapses, the step 30 proceeds to a step S31. Otherwise, the step 30 is repeated again. At the step S31, the controlling unit 9 judges whether or not the RSSI level is smaller than one of the SSI1, SSI2, and RSSI3 that corresponds to the second greatest level value in the SSI1, SSI2, and RSSI3 of the first through third level signals from the memory device 11. When the RSSI level is smaller than the one of the SSI1, SSI2, and RSSI3 that corresponds to the second greatest level value in the SSI1, SSI2, and RSSI3, the step 31 proceeds to a step S32. Otherwise, the step 31 returns to the step 30. At the step S32, the controlling unit 9 judges whether or not the controlling unit 9 is supplied with the human body contact discriminating signal. When the controlling unit 9 is supplied with the human body contact discriminating signal, the step S32 returns to the step S22. Otherwise, the operation is ended.

Figure 9:
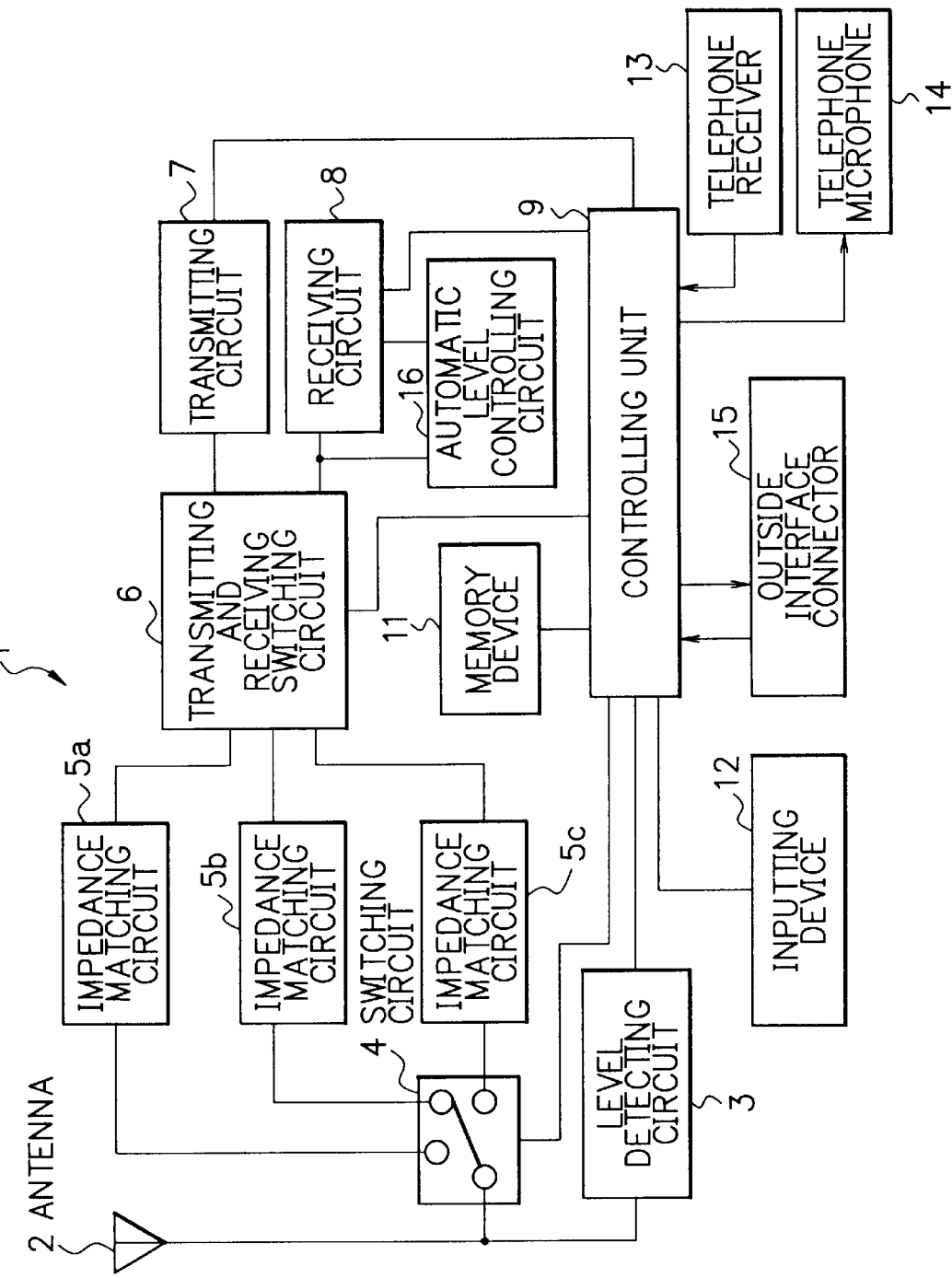
FIG. 9 is a block diagram of a movable radio terminal device according to a third embodiment of this invention.
Figure 10:
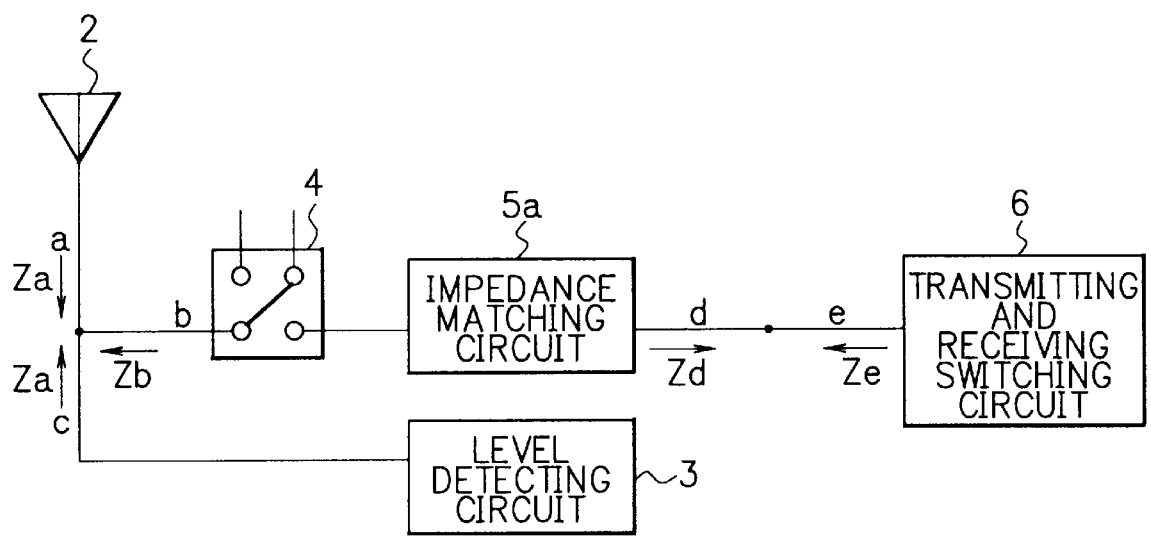
FIG. 10 is a block diagram of a part of the movable radio terminal device illustrated in FIG. 9.

Referring to FIGS. 9, 10, and 11, a movable radio terminal device according to a third embodiment of this invention will be described in detail. Similar parts are designated by like reference numerals. In FIG. 9, the movable radio terminal device 1 comprises the antenna 2, the level detecting circuit 3, the switching circuit 4, the first through third impedance matching circuits 5a to 5c, the transmitting and receiving switching circuit 6, the transmitting circuit 7, the receiving circuit 8, the controlling unit 9, the memory device 11, the inputting device 12, the telephone receiver 13, the telephone microphone 14, and the outside interface connector 15. In the movable radio terminal device 1 according to the third embodiment of this invention, the human body contact discriminating circuit 10 of the movable radio terminal device 1 of FIG. 7 is omitted. The movable radio terminal device 1 further comprises an automatic level controlling circuit 16. The automatic level controlling circuit 16 is connected to the transmitting circuit 7. The automatic level controlling circuit 16 controls the level of the transmitting signal of the transmitting circuit 7.

In FIG. 9, the controlling unit 9 produces and supplies, at every predetermined time interval, the first through third matching switching control signals to the switching circuit 4, respectively, to make the memory device 11 memorize, as the first through third level signals having the first through third level values, the detected level signals from the level detecting circuit 3 when the switching circuit 4 connects the antenna 2 to the first through third impedance matching circuits 5a to 5c, respectively, when the detected level value from the level detecting circuit 3 is smaller than the one of the first through third level values that corresponds to the second greatest level value in the first through third level values of the first through third level signals from the memory device 11.

The controlling unit 9 selects, as the selected level value, one of the first thorough third level values that is greatest in the first through third level values. The controlling unit 9 produces and supplies the one of the first through third matching switching control signals that corresponds to the selected level value to the switching circuit 4.

FIG. 10 shows a relation of complex impedances of the antenna 2, the first impedance matching circuit 5a, the level detecting circuit 3, and the transmitting and receiving switching circuit 6. As shown in FIG. 10, it is assumed that Za represents a complex impedance form (a) side of the antenna 2, Zb represents a complex impedance form a side (b) of the switching circuit 4, Zc represents a complex impedance form a side (c) of the level detecting circuit 3, Zd represents a complex impedance form a side (d) of the first impedance matching circuit 5a, and Ze represents a complex impedance form a side (e) of the transmitting and receiving switching circuit 6. Zc is set at a impedance which does not effect the first through third impedance matching circuits 5a to 5c. Namely, Zc is set at a impedance which is remarkably greater than Za and Zb.

Referring to FIG. 11 together with FIG. 9, an operation of the movable radio terminal device 1 will be described in detail.

At a start step S40, a power source (not shown) of the movable radio terminal device 1 is set at ON. At a step S41, the controlling unit 9 judges whether or not the antenna 2 receives the one of the transmitting signal and the receiving signal. When the antenna 2 receives the one of the transmitting signal and the receiving signal, the step S41 proceeds to a step S42. Otherwise, the step S41 is repeated again. At the step S42, the controlling unit 9 produces and supplies the first matching switching control signal to the switching circuit 4. Thereby, the switching circuit 4 connects the antenna 2 to the first impedance matching circuit 5a. The step S42 proceeds to a step S43 at which the controlling unit 9 makes the memory device 11 memorize, as the first level signal having the first level value, namely, the RSSI1, the detected level signal from the level detecting circuit 3.

The step S43 proceeds to a step S44 at which the controlling unit 9 produces and supplies the second matching switching control signal to the switching circuit 4. Thereby, the switching circuit 4 connects the antenna 2 to the second impedance matching circuit 5b. The step S44 proceeds to a step S45 at which the controlling unit 9 makes the memory device 11 memorize, as the second level signal having the second level value, namely, the RSSI2, the detected level signal from the level detecting circuit 3.

The step S45 proceeds to a step S46 at which the controlling unit 9 produces and supplies the third matching switching control signal to the switching circuit 4. Thereby, the switching circuit 4 connects the antenna 2 to the third impedance matching circuit 5c. The step S46 proceeds to a step S47 at which the controlling unit 9 makes the memory device 11 memorize, as the third level signal having the third level value, namely, the RSSI3, the detected level signal from the level detecting circuit 3.

The step S47 proceeds to a step S48 at which the controlling unit 9 reads the SSI1, SSI2, and RSSI3 from the memory device 11 to select, as the selected level value, one of the SSI1, SSI2, and RSSI3 that is greatest in the SSI1, SSI2, and RSSI3. The step S48 proceeds to a step S49 at which the controlling unit 9 produces and supplies one of first through third matching switching control signals that is corresponds to the selected level value to the switching circuit 4. In this event, the switching circuit 4 connects, in response to the one of the first through third matching switching control signals that corresponds to the selected level value, the antenna 2 to one of the first through third impedance matching circuits 5a to 5c that corresponds to the selected level value.

The step S49 proceeds to a step S50 at which the controlling unit 9 judges whether or not a predetermined time interval elapses. When the predetermined time interval elapses, the step 50 proceeds to a step S51. Otherwise, the step 50 is repeated again. At the step S51, the controlling unit 9 judges whether or not the RSSI level is smaller than one of the SSI1, SSI2, and RSSI3 that corresponds to the second greatest level value in the SSI1, SSI2, and RSSI3 of the first through third level signals from the memory device 11. When the RSSI level is smaller than the one of the SSI1, SSI2, and RSSI3 that corresponds to the second greatest level value in the SSI1, SSI2, and RSSI3, the step 51 proceeds to a step S52. Otherwise, the step 51 returns to the step 50. At the step S52, the controlling unit 9 judges whether or not the power source is OFF. When the power source is not OFF, the step S52 returns to the step S41. Otherwise, the operation is ended.

While this invention has thus far been described in conjunction with a few preferred embodiments thereof, it will readily be possible for those skilled in the art to put this invention into practice in various other manners. For example, the movable radio terminal device 1 of FIG. 7 may comprise first through N-th impedance matching circuits having first through N-th impedances which are different, where N represents an integer greater than three. In this event, the switching circuit 4 is connected to the antenna 2 and to the first through N-th impedance matching circuits. The switching circuit 4 connects, in response to one of first through N-th matching switching control signals, the antenna 2 to one of the first through N-th impedance matching circuits. The transmitting and receiving switching circuit 6 is connected to the first through N-th impedance matching circuits and to the transmitting and receiving circuits 7 and 8. The transmitting and receiving switching circuit 6 connects, in response to transmitting and receiving switching control signals, the first through N-th impedance matching circuits to one of the transmitting and receiving circuits 7 and 8. In addition, the controlling unit 9 produces and supplies, at every predetermined time interval, the first through N-th matching switching control signals to the switching circuit 4, respectively, to make the memory device 11 memorize, as first through N-th level signals having first through N-th level values, the detected level signals from the level detecting circuit 3 when the switching circuit 4 connects the antenna to the first through N-th impedance matching circuits, respectively, when the detected level value from the level detecting circuit 3 is smaller than one of the first through N-th level values that corresponds to the second greatest level value in the first through N-th level values, and when the controlling unit 9 is supplied with the human body contact discriminating signal from the human body contact discriminating circuit 10. The controlling unit 9 selects, as a selected level value, one of the first through N-th level values that is greatest in the first through N-th level values. The controlling unit 9 produces and supplies one of the first through N-th matching switching control signals that corresponds to the selected level value to the switching circuit 4.

Also, the movable radio terminal device 1 of FIG. 9 may comprise first through N-th impedance matching circuits having first through N-th impedances which are different, where N represents an integer greater than three. In this event, the switching circuit 4 is connected to the antenna 2 and to the first through N-th impedance matching circuits. The switching circuit 4 connects, in response to one of first through N-th matching switching control signals, the antenna 2 to one of the first through N-th impedance matching circuits. The transmitting and receiving switching circuit 6 is connected to the first through N-th impedance matching circuits and to the transmitting and receiving circuits 7 and 8. The transmitting and receiving switching circuit 6 connects, in response to transmitting and receiving switching control signals, the first through N-th impedance matching circuits to one of the transmitting and receiving circuits 7 and 8. In addition, the controlling unit 9 produces and supplies, at every predetermined time interval, the first through N-th matching switching control signals to the switching circuit 4, respectively, to make the memory device 11 memorize, as the first through N-th level signals having the first through N-th level values, the detected level signals from the level detecting circuit 4 when the switching circuit connects the antenna to the first through N-th impedance matching circuits, respectively, when the detected level value from the level detecting circuit 3 is smaller than the one of the first through N-th level values that corresponds to the second greatest level value in the first through N-th level values. The controlling unit 9 selects, as the selected level value, the one of the first through N-th level values that is greatest in the first through N-th level values. The controlling unit 9 produces and supplies the one of the first through N-th matching switching control signals that corresponds to the selected level value to the switching circuit 4.

In addition, at the step S31 in FIG. 8 and the step S51 in FIG. 11, the controlling unit 9 may judge whether or not the detected level value from the level detecting circuit 3 is smaller than a reference level value. Also, in FIGS. 8 and 11, the step S31 and the step S51 may be omitted.

Thus, according to this invention, the controlling unit 9 selects, as the selected level value, the one of the first through N-th level values that is greatest in the first through N-th level values. In addition, the controlling unit 9 produces and supplies the one of the first through N-th matching switching control signals that corresponds to the selected level value to the switching circuit 4. Therefore, the movable radio terminal device of this invention is capable of precisely matching impedances of the antenna 2 and an internal circuit.

What is claimed is:

1. A movable radio terminal device comprising:

an antenna receiving a radio receiving signal to produce a receiving signal, said antenna receiving a transmitting signal to produce a radio transmitting signal;

a level detecting circuit connected to said antenna for detecting a level of one of said receiving signal and said transmitting signal to produce a detected level signal having a detected level value;

first through N-th impedance matching circuits having first through N-th impedances which are different, where N represents an integer greater than one;

a switching circuit connected to said antenna and to said first through N-th impedance matching circuits for connecting, in response to one of first through N-th matching switching control signals, said antenna to one of said first through N-th impedance matching circuits;

a transmitting circuit connected to said transmitting and receiving switching circuit for producing said transmitting signal;

a receiving circuit connected to said transmitting and receiving switching circuit for receiving said receiving signal;

a transmitting and receiving switching circuit connected to said first through N-th impedance matching circuits and to said transmitting and receiving circuits for connecting, in response to transmitting and receiving switching control signals, said first through N-th impedance matching circuits to one of said transmitting and receiving circuits;

a controlling unit connected to said level detecting circuit, to said switching circuit, to said transmitting and receiving switching circuit, and to said transmitting and receiving circuits for producing and supplying said transmitting and receiving switching control signals to said transmitting and receiving switching circuit, respectively;

a human body contact discriminating circuit connected to said controlling unit for discriminating whether or not a human body is contact with said movable radio terminal device to produce and supply a human body contact discriminating signal to said controlling unit when said human body is contact with said movable radio terminal device; and a memory device connected to said controlling unit;

said controlling unit producing and supplying said first matching switching control signal to said switching circuit when said controlling unit is not supplied with said human body contact discriminating signal from said human body contact discriminating circuit, said controlling unit producing and supplying, at every predetermined time interval, said first through N-th matching switching control signals to said switching circuit, respectively, to make said memory device memorize, as first through N-th level signals having first through N-th level values, said detected level signals from said level detecting circuit when said switching circuit connects said antenna to said first through N-th impedance matching circuits, respectively, and when said controlling unit is supplied with said human body contact discriminating signal from said human body contact discriminating circuit, said controlling unit selecting, as a selected level value, one of said first through N-th level values that is greatest in said first through N-th level values, said controlling unit producing and supplying one of said first through N-th matching switching control signals that corresponds to said selected level value to said switching circuit.

2. A movable radio terminal device comprising:

an antenna receiving a radio receiving signal to produce a receiving signal, said antenna receiving a transmitting signal to produce a radio transmitting signal;

a level detecting circuit connected to said antenna for detecting a level of one of said receiving signal and said transmitting signal to produce a detected level signal having a detected level value;

first through N-th impedance matching circuits having first through N-th impedances which are different, where N represents an integer greater than one;

a switching circuit connected to said antenna and to said first through N-th impedance matching circuits for connecting, in response to one of first through N-th matching switching control signals, said antenna to one of said first through N-th impedance matching circuits;

a transmitting circuit connected to said transmitting and receiving switching circuit for producing said transmitting signal;

a receiving circuit connected to said transmitting and receiving switching circuit for receiving said receiving signal;

a transmitting and receiving switching circuit connected to said first through N-th impedance matching circuits and to said transmitting and receiving circuits for connecting, in response to transmitting and receiving switching control signals, said first through N-th impedance matching circuits to one of said transmitting and receiving circuits;

a controlling unit connected to said level detecting circuit, to said switching circuit, to said transmitting and receiving switching circuit, and to said transmitting and receiving circuits for producing and supplying said transmitting and receiving switching control signals to said transmitting and receiving switching circuit, respectively;

a human body contact discriminating circuit connected to said controlling unit for discriminating whether or not a human body is contact with said movable radio terminal device to produce and supply a human body contact discriminating signal to said controlling unit when said human body is contact with said movable radio terminal device; and a memory device connected to said controlling unit;

said controlling unit producing and supplying said first matching switching control signal to said switching circuit when said controlling unit is not supplied with said human body contact discriminating signal from said human body contact discriminating circuit, said controlling unit producing and supplying, at every predetermined time interval, said first through N-th matching switching control signals to said switching circuit, respectively, to make said memory device memorize, as first through N-th level signals having first through N-th level values, said detected level signals from said level detecting circuit when said switching circuit connects said antenna to said first through N-th impedance matching circuits, respectively, when said detected level value from said level detecting circuit is smaller than one of said first through N-th level values that corresponds to the second greatest level value in said first through N-th level values, and when said controlling unit is supplied with said human body contact discriminating signal from said human body contact discriminating circuit, said controlling unit selecting, as a selected level value, one of said first through N-th level values that is greatest in said first through N-th level values, said controlling unit producing and supplying one of said first through N-th matching switching control signals that corresponds to said selected level value to said switching circuit.

3. A movable radio terminal device comprising:

an antenna receiving a radio receiving signal to produce a receiving signal, said antenna receiving a transmitting signal to produce a radio transmitting signal;

a level detecting circuit connected to said antenna for detecting a level of one of said receiving signal and said transmitting signal to produce a detected level signal having a detected level value;

first through N-th impedance matching circuits having first through N-th impedances which are different, where N represents an integer greater than one;

a switching circuit connected to said antenna and to said first through N-th impedance matching circuits for connecting, in response to one of first through N-th matching switching control signals, said antenna to one of said first through N-th impedance matching circuits;

a transmitting circuit connected to said transmitting and receiving switching circuit for producing said transmitting signal;

a receiving circuit connected to said transmitting and receiving switching circuit for receiving said receiving signal;

a transmitting and receiving switching circuit connected to said first through N-th impedance matching circuits and to said transmitting and receiving circuits for connecting, in response to transmitting and receiving switching control signals, said first through N-th impedance matching circuits to one of said transmitting and receiving circuits;

a controlling unit connected to said level detecting circuit, to said switching circuit, to said transmitting and receiving switching circuit, and to said transmitting and receiving circuits for producing and supplying said transmitting and receiving switching control signals to said transmitting and receiving switching circuit, respectively;

a human body contact discriminating circuit connected to said controlling unit for discriminating whether or not a human body is contact with said movable radio terminal device to produce and supply a human body contact discriminating signal to said controlling unit when said human body is contact with said movable radio terminal device; and a memory device connected to said controlling unit;

said controlling unit producing and supplying said first matching switching control signal to said switching circuit when said controlling unit is not supplied with said human body contact discriminating signal from said human body contact discriminating circuit, said controlling unit producing and supplying, at every predetermined time interval, said first through N-th matching switching control signals to said switching circuit, respectively, to make said memory device memorize, as first through N-th level signals having first through N-th level values, said detected level signals from said level detecting circuit when said switching circuit connects said antenna to said first through N-th impedance matching circuits, respectively, when said detected level value from said level detecting circuit is smaller than a reference level value, and when said controlling unit is supplied with said human body contact discriminating signal from said human body contact discriminating circuit, said controlling unit selecting, as a selected level value, one of said first through N-th level values that is greatest in said first through N-th level values, said controlling unit producing and supplying one of said first through N-th matching switching control signals that corresponds to said selected level value to said switching circuit.

4. A movable radio terminal device comprising:

an antenna receiving a radio receiving signal to produce a receiving signal, said antenna receiving a transmitting signal to produce a radio transmitting signal;

a level detecting circuit connected to said antenna for detecting a level of one of said receiving signal and said transmitting signal to produce a detected level signal having a detected level value;

first through N-th impedance matching circuits having first through N-th impedances which are different, where N represents an integer greater than one;

a switching circuit connected to said antenna and to said first through N-th impedance matching circuits for connecting, in response to one of first through N-th matching switching control signals, said antenna to one of said first through N-th impedance matching circuits;

a transmitting circuit connected to said transmitting and receiving switching circuit for producing said transmitting signal;

a receiving circuit connected to said transmitting and receiving switching circuit for receiving said receiving signal;

a transmitting and receiving switching circuit connected to said first through N-th impedance matching circuits and to said transmitting and receiving circuits for connecting, in response to transmitting and receiving switching control signals, said first through N-th impedance matching circuits to one of said transmitting and receiving circuits;

a controlling unit connected to said level detecting circuit, to said switching circuit, to said transmitting and receiving switching circuit, and to said transmitting and receiving circuits for producing and supplying said transmitting and receiving switching control signals to said transmitting and receiving switching circuit, respectively; and a memory device connected to said controlling unit;

said controlling unit producing and supplying, at every predetermined time interval, said first through N-th matching switching control signals to said switching circuit, respectively, to make said memory device memorize, as first through N-th level signals having first through N-th level values, said detected level signals from said level detecting circuit when said switching circuit connects said antenna to said first through N-th impedance matching circuits, respectively, said controlling unit selecting, as a selected level value, one of said first through N-th level values that is greatest in said first through N-th level values, said controlling unit producing and supplying one of said first through N-th matching switching control signals that corresponds to said selected level value to said switching circuit.

5. A movable radio terminal device comprising:

an antenna receiving a radio receiving signal to produce a receiving signal, said antenna receiving a transmitting signal to produce a radio transmitting signal;

a level detecting circuit connected to said antenna for detecting a level of one of said receiving signal and said transmitting signal to produce a detected level signal having a detected level value;

first through N-th impedance matching circuits having first through N-th impedances which are different, where N represents an integer greater than one;

a switching circuit connected to said antenna and to said first through N-th impedance matching circuits for connecting, in response to one of first through N-th matching switching control signals, said antenna to one of said first through N-th impedance matching circuits;

a transmitting circuit connected to said transmitting and receiving switching circuit for producing said transmitting signal;

a receiving circuit connected to said transmitting and receiving switching circuit for receiving said receiving signal;

a transmitting and receiving switching circuit connected to said first through N-th impedance matching circuits and to said transmitting and receiving circuits for connecting, in response to transmitting and receiving switching control signals, said first through N-th impedance matching circuits to one of said transmitting and receiving circuits;

a controlling unit connected to said level detecting circuit, to said switching circuit, to said transmitting and receiving switching circuit, and to said transmitting and receiving circuits for producing and supplying said transmitting and receiving switching control signals to said transmitting and receiving switching circuit, respectively; and a memory device connected to said controlling unit;

said controlling unit producing and supplying, at every predetermined time interval, said first through N-th matching switching control signals to said switching circuit, respectively, to make said memory device memorize, as first through N-th level signals having first through N-th level values, said detected level signals from said level detecting circuit when said switching circuit connects said antenna to said first through N-th impedance matching circuits, respectively, when said detected level value from said level detecting circuit is smaller than one of said first through N-th level values that corresponds to the second greatest level value in said first through N-th level values, said controlling unit selecting, as a selected level value, one of said first through N-th level values that is greatest in said first through N-th level values, said controlling unit producing and supplying one of said first through N-th matching switching control signals that corresponds to said selected level value to said switching circuit.

6. A movable radio terminal device comprising:

an antenna receiving a radio receiving signal to produce a receiving signal, said antenna receiving a transmitting signal to produce a radio transmitting signal;

a level detecting circuit connected to said antenna for detecting a level of one of said receiving signal and said transmitting signal to produce a detected level signal having a detected level value;

first through N-th impedance matching circuits having first through N-th impedances which are different, where N represents an integer greater than one;

a switching circuit connected to said antenna and to said first through N-th impedance matching circuits for connecting, in response to one of first through N-th matching switching control signals, said antenna to one of said first through N-th impedance matching circuits;

a transmitting circuit connected to said transmitting and receiving switching circuit for producing said transmitting signal;

a receiving circuit connected to said transmitting and receiving switching circuit for receiving said receiving signal;

a transmitting and receiving switching circuit connected to said first through N-th impedance matching circuits and to said transmitting and receiving circuits for connecting, in response to transmitting and receiving switching control signals, said first through N-th impedance matching circuits to one of said transmitting and receiving circuits;

a controlling unit connected to said level detecting circuit, to said switching circuit, to said transmitting and receiving switching circuit, and to said transmitting and receiving circuits for supplying said transmitting and receiving switching control signals to said transmitting and receiving switching circuit, respectively; and a memory device connected to said controlling unit;

said controlling unit producing and supplying, at every predetermined time interval, said first through N-th matching switching control signals to said switching circuit, respectively, to make said memory device memorize, as first through N-th level signals having first through N-th level values, said detected level signals from said level detecting circuit when said switching circuit connects said antenna to said first through N-th impedance matching circuits, respectively, when said detected level value from said level detecting circuit is smaller than a reference level value, said controlling unit selecting, as a selected level value, one of said first through N-th level values that is greatest in said first through N-th level values, said controlling unit producing and supplying one of said first through N-th matching switching control signals that corresponds to said selected level value to said switching circuit.

* * * * *